United States Patent
Shen et al.

(10) Patent No.: US 11,469,739 B2
(45) Date of Patent: Oct. 11, 2022

(54) FILTER CAPACITOR DISCHARGE CIRCUIT, CONVERSION CIRCUIT, AND OPERATION METHOD OF DISCHARGING FILTER CAPACITOR

(71) Applicant: POWER DESIGN CORPORATION LIMITED, Central (HK)

(72) Inventors: Yi-Lun Shen, Central (HK); Yu-Yun Huang, Central (HK)

(73) Assignee: ARK SEMICONDUCTOR CORP. LTD., Shenzhen (CN)

( * ) Notice: Subject to any disclaimer, the term of this patent is extended or adjusted under 35 U.S.C. 154(b) by 0 days.

(21) Appl. No.: 17/371,200

(22) Filed: Jul. 9, 2021

(65) Prior Publication Data

US 2022/0038078 A1 Feb. 3, 2022

(30) Foreign Application Priority Data

Jul. 31, 2020 (TW) ................................. 109125958
Apr. 28, 2021 (TW) ................................. 110115373

(51) Int. Cl.
*H03H 11/04* (2006.01)
*H03K 5/24* (2006.01)
*H03K 19/20* (2006.01)

(52) U.S. Cl.
CPC ............... *H03H 11/04* (2013.01); *H03K 5/24* (2013.01); *H03K 19/20* (2013.01)

(58) Field of Classification Search
CPC .......... H03H 11/04; H03K 5/24; H03K 19/20; H02M 3/28; H02M 1/32; H02M 3/335; H02M 1/322; H02M 7/06; H02M 1/44; H02M 1/36; H02M 1/12; H02M 3/07; H02M 1/08

See application file for complete search history.

(56) References Cited

U.S. PATENT DOCUMENTS

| | | | |
|---|---|---|---|
| 9,537,417 B2 * | 1/2017 | Shiroyama | H02M 7/02 |
| 2009/0141523 A1 * | 6/2009 | Sugawara | H02M 1/4225 363/89 |
| 2018/0269800 A1 * | 9/2018 | Endo | G01R 19/12 |

FOREIGN PATENT DOCUMENTS

TW 201902094 A 1/2019

* cited by examiner

*Primary Examiner* — John W Poos
(74) *Attorney, Agent, or Firm* — Muncy, Geissler, Olds & Lowe, P.C.

(57) ABSTRACT

A filter capacitor discharge circuit includes a high-voltage terminal, a signal preparation circuit, a low-pass filter, a voltage level detector, a timer unit, and a switch unit. The signal preparation circuit receives a detection signal corresponding to an AC voltage from the high-voltage terminal, and generates a voltage signal according to the detection signal. The low-pass filter provides a filtered signal according to the voltage signal. The voltage level detector checks whether a voltage difference between the voltage signal and the filtered signal is less than a predetermined value. When the voltage difference is less than the predetermined value, the timer unit performs time calculation to accumulate a timing result. When the timing result exceeds a predetermined time, the switch unit is turned on so that the firster capacitor is discharged through the switch unit.

17 Claims, 9 Drawing Sheets

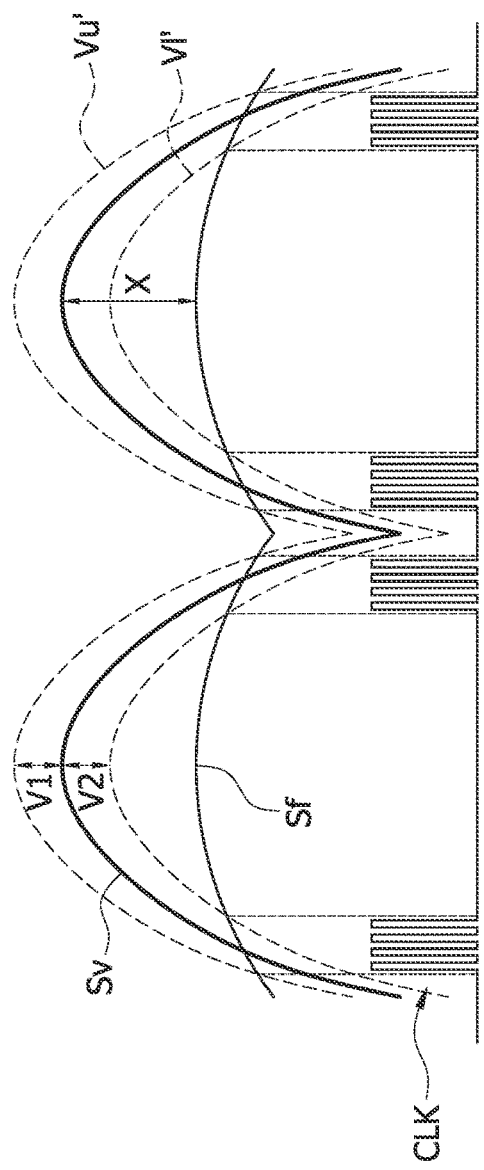
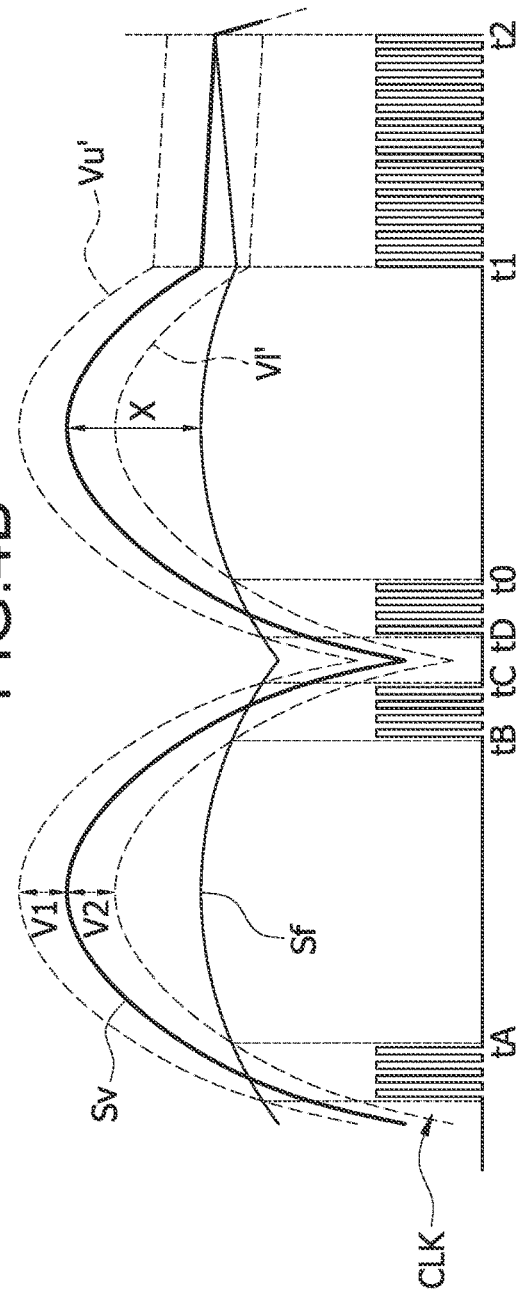
FIG.4B
FIG.4C

FILTER CAPACITOR DISCHARGE CIRCUIT, CONVERSION CIRCUIT, AND OPERATION METHOD OF DISCHARGING FILTER CAPACITOR

BACKGROUND

Technical Field

The present disclosure relates to a discharge circuit, a conversion circuit, and an operation method of discharging, and more particularly to a filter capacitor discharge circuit, a conversion circuit, and an operation method of discharging a filter capacitor for an EMI filter capacitor.

Description of Related Art

The statements in this section merely provide background information related to the present disclosure and do not necessarily constitute prior art.

Since today's electronic products focus on the quality of the input voltage (i.e., AC voltage) received by the conversion circuit, the front end of the conversion circuit usually uses an EMI (electromagnetic interference) filter to reduce the electromagnetic interference. The EMI filter usually includes a capacitor coupled to the input end of the conversion circuit, which is usually referred to as a filter capacitor or an X capacitor. When a plug at the input end of the conversion circuit is removed from the socket to interrupt the AC voltage, the voltage across the filter capacitor is not released to keep a high voltage. If this high voltage is not consumed by the internal resistor for a long period of time, it will continue to be charged, causing the user to feel the risk of electric shock when touching the plug of the conversion circuit.

Accordingly, the present disclosure provides a filter capacitor discharge circuit, a conversion circuit, and an operation method of discharging a filter capacitor to discharge the filter capacitor without affecting the working efficiency of the conversion circuit during operation when a plug of the conversion circuit is unplugged or removed to interrupt the AC voltage.

SUMMARY

In order to solve the above-mentioned problems, the present disclosure provides a filter capacitor discharge circuit. The filter capacitor discharge circuit includes a high-voltage terminal, a signal preparation circuit, a low-pass filter, a voltage level detector, a timer unit, and a switch unit. The high-voltage terminal is coupled to a filter capacitor at an input end, and the input end receives an AC voltage. The signal preparation circuit is coupled to the high-voltage terminal, and generates a voltage signal representing the AC voltage. The low-pass filter provides a filtered signal according to the voltage signal. The voltage level detector compares the voltage signal and the filtered signal, and checks whether a voltage difference between the voltage signal and the filtered signal is less than a predetermined value. The timer unit performs time calculation to accumulate a timing result when the voltage difference is less than the predetermined value. The switch unit is turned on by the timer unit when the timing result exceeds a predetermined time so that the filter capacitor is discharged through the switch unit.

In order to solve the above-mentioned problems, the present disclosure provides a conversion circuit. The conversion circuit includes a filter capacitor, a detection circuit, and a filter capacitor discharge circuit. The filter capacitor receives an AC voltage at an input end. The detection circuit detects the AC voltage and provides a detection signal. The filter capacitor discharge circuit receives the detection signal through a high-voltage terminal.

In order to solve the above-mentioned problems, the present disclosure provides an operation method of discharging a filter capacitor. The filter capacitor is coupled to an input end to receive an AC voltage. The operation method includes steps of: providing a voltage signal representing the AC voltage according to the AC voltage, filtering the voltage signal in a low-pass manner to generate a filtered signal, checking whether a voltage difference between the voltage signal and the filtered signal is less than a predetermined value, performing time calculation to accumulate a timing result when the voltage difference is less than the predetermined value, and discharging the filter capacitor when the timing result exceeds a predetermined time.

The main purpose and effect of the present disclosure are: the filter capacitor discharge circuit is used to check whether a voltage difference between the voltage signal and the filtered signal is less than a predetermined value to decide whether to turn on the switch unit when a plug of the conversion circuit is unplugged or removed to interrupt the AC voltage so that the energy stored in the filter capacitor is released to comply with safety regulations and avoid the risk of electric shock.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows:

FIG. 4B is a schematic waveform diagram of operating the voltage level detector with the AC voltage according to the second embodiment of the present disclosure.

FIG. 4C is a schematic waveform diagram of operating the voltage level detector without the AC voltage according to the second embodiment of the present disclosure.

DETAILED DESCRIPTION

Figure 1:
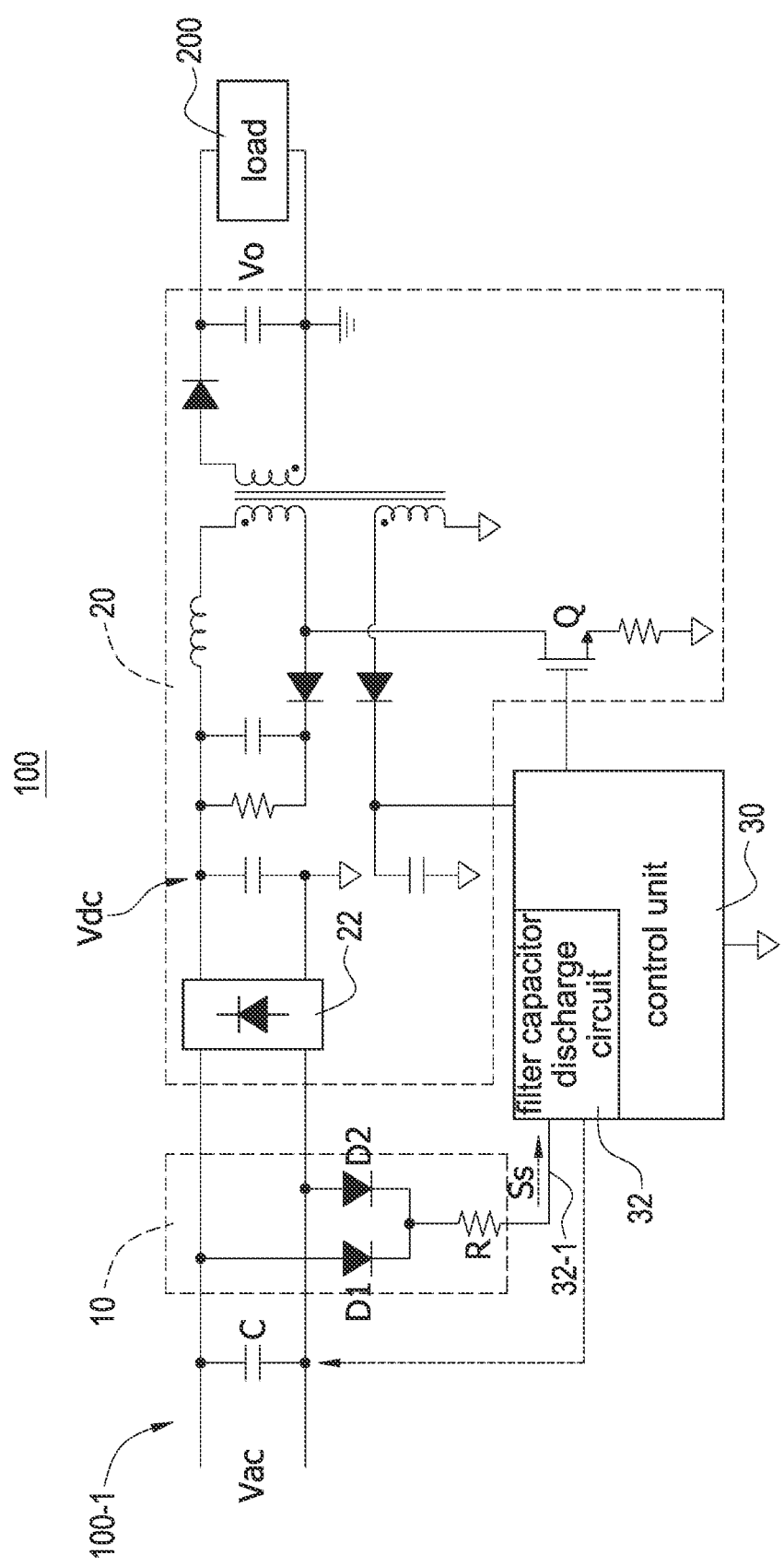
FIG. 1 is a block circuit diagram of a conversion circuit having a filter capacitor discharge circuit according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a block circuit diagram of a conversion circuit having a filter capacitor discharge circuit according to the present disclosure. An input end 100-1 of the conversion circuit 100 receives an AC voltage Vac, and the conversion circuit 100 converts the AC voltage Vac into an output voltage Vo for supplying power to a load 200. The conversion circuit 100 includes a filter capacitor C, a detection circuit 10, a conversion unit 20, and a control unit 30. The filter capacitor C is coupled to the input end 100-1, and filters the AC voltage Vac. The detection circuit 10 detects the AC voltage Vac, and provides a detection signal Ss to the control unit 30 according to the AC voltage Vac. The control unit 30 controls the conversion unit 20 to convert the AC voltage Vac into the output voltage Vo, and controls whether the filter capacitor C discharges or not (indicated by a dotted line with an arrow) according to the received detection signal Ss.

The control unit 30 includes a filter capacitor discharge circuit 32. The filter capacitor discharge circuit 32 receives the detection signal Ss through a high-voltage terminal 32-1, and determines whether the filter capacitor C is discharged or not according to the detection signal Ss. When the filter capacitor discharge circuit 32 determines that the AC voltage Vac is present according to the detection signal Ss, the filter capacitor discharge circuit 32 does not discharge the filter capacitor C to maintain the stable operation of the conversion circuit 100. When the filter capacitor discharge circuit 32 determines that the AC voltage Vac is absent (for example, but not limited to, the plug is unplugged (removed)) according to the detection signal Ss, the filter capacitor discharge circuit 32 discharges the filter capacitor C to release the remaining energy stored in the filter capacitor C to comply with safety regulations and avoid the risk of electric shock.

The detection circuit 10 includes a first diode D1, a second diode D2, and a resistor R. The first diode D1 and the second diode D2 rectify the AC voltage Vac into the detection signal Ss with a continuous half-sine wave. The resistor R is used to limit a current flowing through the detection circuit 10 to avoid damaging the control unit 30 due to an excessive current flowing through the high-voltage terminal 32-1. In one embodiment, the structure of the detection circuit 10 is not limited; as long as any detection circuit (such as a full-bridge rectifier) that may rectify the AC voltage Vac into the detection signal Ss with a continuous or discontinuous half-sine wave should be included in the scope of the present disclosure.

Take the conversion unit 20 to be a flyback converter as an example. The conversion unit 20 converts the AC voltage Vac into a DC voltage Vdc through a rectifier circuit 22. The control unit 30 controls switching a power switch Q (i.e., a main switch of the flyback converter) to convert the DC voltage Vdc into the output voltage Vo. In particular, the conversion unit 20 is not limited to the flyback converter, as long as a conversion apparatus with a DC conversion function should be included in the scope of the present disclosure. Since the manner of supplying power to the control unit 30 and the manner of feedback detecting and controlling the conversion unit 20 by the control unit 30 are the technologies well known to those skilled in the art, and the detail description is omitted here for conciseness.

Figure 2:
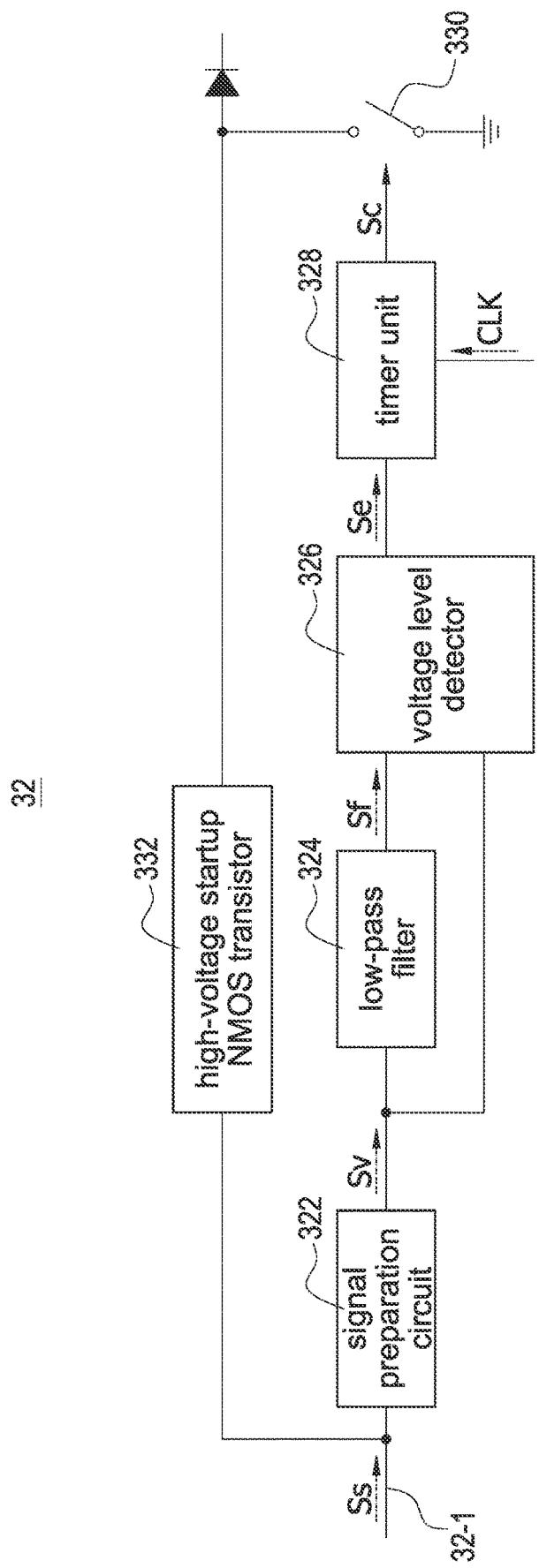
FIG. 2 is a block circuit diagram of the filter capacitor discharge circuit according to the present disclosure.

Please refer to FIG. 2, which shows a block circuit diagram of the filter capacitor discharge circuit according to the present disclosure, and also refer to FIG. 1. The filter capacitor discharge circuit 32 includes the high-voltage terminal 32-1, a signal preparation circuit 322, a low-pass filter 324, a voltage level detector 326, a timer unit 328, a switch unit 330, and a transistor 332 (such as a high-voltage startup NMOS transistor in one embodiment). The switch unit 330 is used to discharge the filter capacitor C, and therefore the coupling position thereof is conductive to discharge the filter capacitor C through the switch unit 330, and it not limited to that shown in FIG. 2. In one embodiment shown in FIG. 2, when the switch unit 330 is turned on, the filter capacitor C may be discharged through the high-voltage startup NMOS transistor 332 and the detection circuit 10. In other embodiments, the switch unit 330 may directly discharge the filter capacitor C.

The signal preparation circuit 322 receives the detection signal Ss through the high-voltage terminal 32-1, and generates a voltage signal Sv representing the AC voltage Vac according to the detection signal Ss. The signal preparation circuit 322 is, for example but not limited to, a step-down circuit. The signal preparation circuit 322 is used to receive the detection signal Ss with a high voltage and converts the high-voltage detection signal Ss into the voltage signal Sv with a low voltage that the control unit 30 can withstand. The signal preparation circuit 322 may be a voltage-dividing circuit formed by external resistors of the control unit 30, or a voltage-dividing or step-down circuit formed by integrated circuit components (such as resistors, transistor, and/or so on) inside the control unit 30.

The low-pass filter 324 receives the voltage signal Sv, and provides a filtered signal Sf according to the voltage signal Sv. In particular, the low-pass filter 324 may be a one-order, a two-order, or a third-order low-pass filter. The higher the order of the filter, the corresponding filtering effect is closer to the ideal.

The voltage level detector 326 receives the voltage signal Sv and the filtered signal Sf, compares the voltage signal Sv with the filtered signal Sf, and provides an enabled signal Se to the timer unit 328 according to a comparison result. Specifically, the voltage level detector 326 is used to check whether a voltage difference between the voltage signal Sv and the filtered signal Sf is less than a predetermined value. When the voltage difference is less than the predetermined value, it means that a voltage value of the voltage signal Sv is close to a voltage value of the filtered signal Sf. The reason may be that a voltage value of the AC voltage Vac is rising (increased) or falling (decreased), or the plug is unplugged (removed). When the voltage value of the AC voltage Vac is rising or falling, a time period when the voltage difference is less than the predetermined value is usually shorter. When the plug is unplugged (removed), the time period when the voltage difference is less than the predetermined value is usually longer. Therefore, this feature may be used to determine whether the plug is unplugged (removed) to decide whether to discharge the filter capacitor C or not.

The timer unit 328 receives the enabled signal Se and a clock signal CLK, and provides the control signal Sc to the switch unit 330 according to the enabled signal Se and the clock signal CLK. When the voltage difference is less than the predetermined value according to the enabled signal Se, the timer unit 328 performs time calculation (counting) to generate pulse number according to the clock signal CLK, and determines whether to control the switch unit 330 to turn on according to the pulse number. For example, when the pulse number is greater than or equal to a predetermined number, it means that the plug is unplugged (removed). At this condition, the timer unit 328 controls the switch unit 330 to turn on through the control signal Sc so that the energy stored in the filter capacitor C is released (discharged) through the turned-on switch unit 330. In another embodiment, the timer unit 328 is triggered by the enabled signal Se to make a ramp signal gradually increase. When the ramp signal is greater than a predetermined value, it is determined that a timing result (counting result) has exceeded a predetermined time, that is, the plug is unplugged (removed), and therefore the switch unit 330 is turned on and the filter capacitor C is released (discharged) through the switch unit 330.

The predetermined time, the predetermined number, and/or the predetermined value may be pre-set by the filter capacitor discharge circuit 32, and may be adjusted according to actual needs. In one embodiment, the predetermined time may be about hundreds of microseconds (p).

Figure 3A:
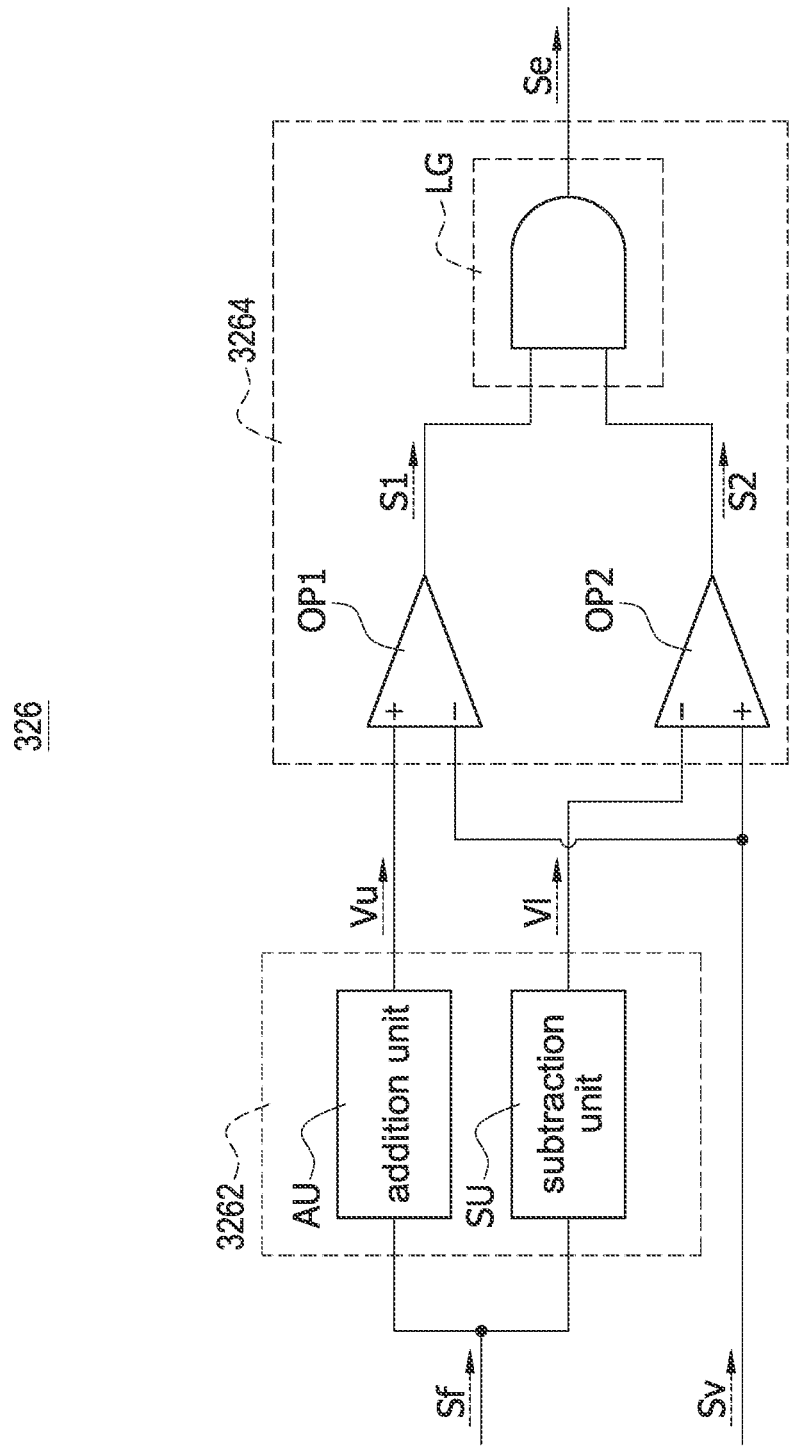
FIG. 3A is a block circuit diagram of a voltage level detector according to a first embodiment of the present disclosure.

Please refer to FIG. 3A, which shows a block circuit diagram of a voltage level detector according to a first embodiment of the present disclosure, and also refer to FIG. 1 to FIG. 2. The voltage level detector 326 includes a limit generation circuit 3262 and a comparison circuit 3264. The limit generation circuit 3262 receives the filtered signal Sf, and generates an upper limit voltage Vu corresponding to an upper limit of the voltage difference and a lower limit voltage V1 corresponding to a lower limit of the voltage difference according to the filtered signal Sf. The comparison circuit 3264 is used to check whether the voltage signal Sv falls between the upper limit voltage Vu and the lower limit voltage V1, and provides the enabled signal Se to the timer unit 328 according to a check result. When the voltage signal Sv falls between the upper limit voltage Vu and the lower limit voltage V1, it means that the voltage difference between the voltage signal Sv and the filtered signal Sf is less than the predetermined value. In particular, the voltage difference represents a voltage difference between the upper limit voltage Vu and the lower limit voltage V1.

Specifically, the voltage level detector 3262 includes an addition unit AU and a subtraction unit SU. The addition unit AU and the subtraction unit SU are coupled between the low-pass filter 324 and the comparison circuit 3264. The addition unit AU is used to add a first reference voltage V1 to the filtered signal Sf to generate the upper limit voltage Vu; the subtraction unit SU is used to subtract a second reference voltage V2 from the filtered signal Sf to generate the lower limit voltage V1. In particular, a voltage value of the first reference voltage V1 and a voltage value of the second reference voltage V2 may be the same or different. In practical applications, the voltage difference may be adjusted by adjusting the voltage value of the first reference voltage V1 and the voltage value of the second reference voltage V2.

The comparison circuit 3264 includes a first comparison unit OP1, a second comparison unit OP2, and a logic unit LG. The first comparison unit OP1 compares the upper limit voltage Vu with the voltage signal Sv to provide a first comparison signal S1. The second comparison unit OP2 compares the lower limit voltage V1 with the voltage signal Sv to provide a second comparison signal S2. The logic unit LG provides the enabled signal Se to the timer unit 328 according to the first comparison signal S1 and the second comparison signal S2. In one embodiment, the logic unit LG may be an AND gate.

When the first comparison signal S1 and the second comparison signal S2 are both a first level, it means that the voltage difference between the voltage signal Sv and the filtered signal Sf is less than the predetermined value. At this condition, the comparison circuit 3264 uses the enabled signal Se to notify the timer unit 328 to perform time calculation (counting), that is, the timer unit 328 performs counting the clock signal CLK. In one embodiment, the first comparison unit OP1 and the second comparison unit OP2 are, for example but not limited to, comparators. In other words, as long as a comparison unit, for example but not limited to, a self-designed comparison unit composed of a voltage-dividing circuit that can compare two input signals to generate the comparison result, it should be included in the scope of the present disclosure. In one embodiment, the logic unit LG is not limited to be implemented by the AND gate. In other words, as long as a logic unit (for example but not limited to, a NAND gate) that can convert two input signals to the same level and correspondingly convert the level of the output signal should be included in the scope of the present disclosure.

Figure 3B:
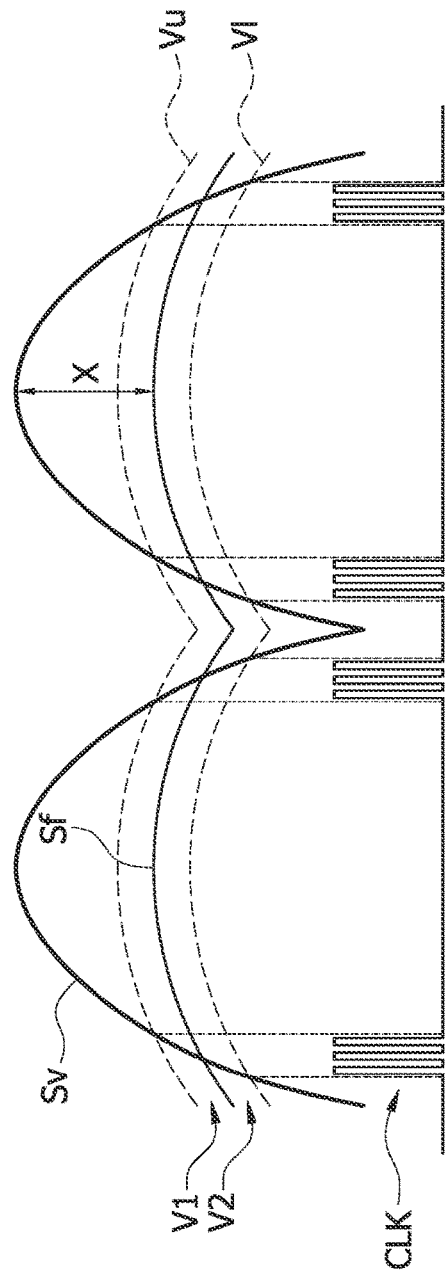
FIG. 3B is a schematic waveform diagram of operating the voltage level detector with an AC voltage according to the first embodiment of the present disclosure.
Figure 3C:
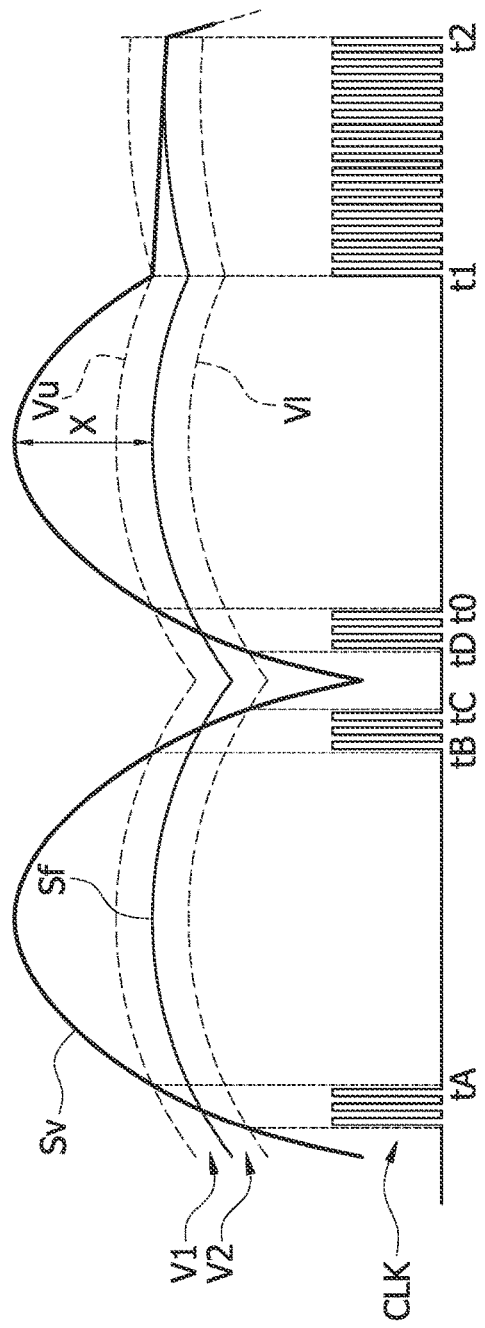
FIG. 3C is a schematic waveform diagram of operating the voltage level detector without the AC voltage according to the first embodiment of the present disclosure.

Please refer to FIG. 3B, which shows a schematic waveform diagram of operating the voltage level detector with an AC voltage according to the first embodiment of the present disclosure, FIG. 3C, which shows a schematic waveform diagram of operating the voltage level detector without the AC voltage according to the first embodiment of the present disclosure, and also refer to FIG. 1 to FIG. 3A. The high-voltage terminal 32-1 receives the detection signal Ss with a continuous half-sine wave, and the signal preparation circuit 322 steps down the detection signal Ss to the voltage signal Sv. The low-pass filter 324 filters the voltage signal Sv to generate the filtered signal Sf, and the voltage level detector 3262 generates the upper limit voltage Vu corresponding to the voltage difference X according to the filtered signal Sf and the first reference voltage V1, and generates the lower limit voltage V1 corresponding to the voltage difference X according to the filtered signal Sf and the second reference voltage V2. In FIG. 3B, when the voltage value of the voltage signal Sv is rising (increased) or falling (decreased), the voltage difference X between the voltage signal Sv and the filtered signal Sf is less than the predetermined value since the voltage signal Sv falls between the upper limit voltage Vu and the lower limit voltage V1 for a short period of time. At this condition, the logic unit LG notifies the timer unit 328 to perform time calculation, that is, the timer unit 328 performs counting the clock signal CLK. When the AC voltage Vac is present, since the voltage value of the voltage signal Sv is rising or falling, and a time period when the voltage value falls between the upper limit voltage Vu and the lower limit voltage V1 is shorter, the pulse number accumulated by the timer unit 328 is not greater than or equal to the predetermined number (or the time accumulated by the timer unit 328 is not greater than or equal to the predetermined time). At this condition, the control signal Sc provided by the timer unit 328 maintains the switch unit 330 to be turned off, and therefore the filter capacitor C is not released (discharged).

In FIG. 3C, at time t1, the plug is unplugged (removed). At this condition, the AC voltage Vac is disconnected so that the change of the voltage signal Sv with the continuous half-sine wave is interrupted so that the voltage signal Sv is slowly decreased by a roughly fixed value, and the fixed value is the remaining energy stored in the filter capacitor C. At this condition, since the change of the voltage signal Sv with the continuous half-sine wave is interrupted, the voltage value of the filtered voltage signal Sv (i.e., the filtered signal Sf) through the low-pass filter 324 is maintained at a fixed value. Therefore, the voltage value of the voltage signal Sv falls between the upper limit voltage Vu and the lower limit voltage Vl, that is, the upper limit voltage Vu and the lower limit voltage Vl are close to the voltage value of the voltage signal Sv so that the voltage difference X is less than the predetermined value. For convenience of demonstration, when the plug is unplugged (removed) at time t1, the voltage signal Sv falls between the upper limit voltage Vu and the lower limit voltage Vl. At time t1, the logic unit LG notifies the timer unit 328 to perform time calculation, that is, the timer unit 328 performs counting the clock signal CLK. Since the voltage signal Sv roughly maintained at a fixed value and the voltage difference X is always less than the predetermined value, the timer unit 328 continuously counts the clock signal CLK. At time t2, since the timer unit 328 determines that the pulse number is greater than or equal to the predetermined number or the time counted by the timer unit 328 is greater than or equal to the predetermined time (during time t1 and time t2), the timer unit 328 controls the control signal Sc to turn on the switch unit 330 to release the remaining energy stored in the filter capacitor C.

Figure 4A:
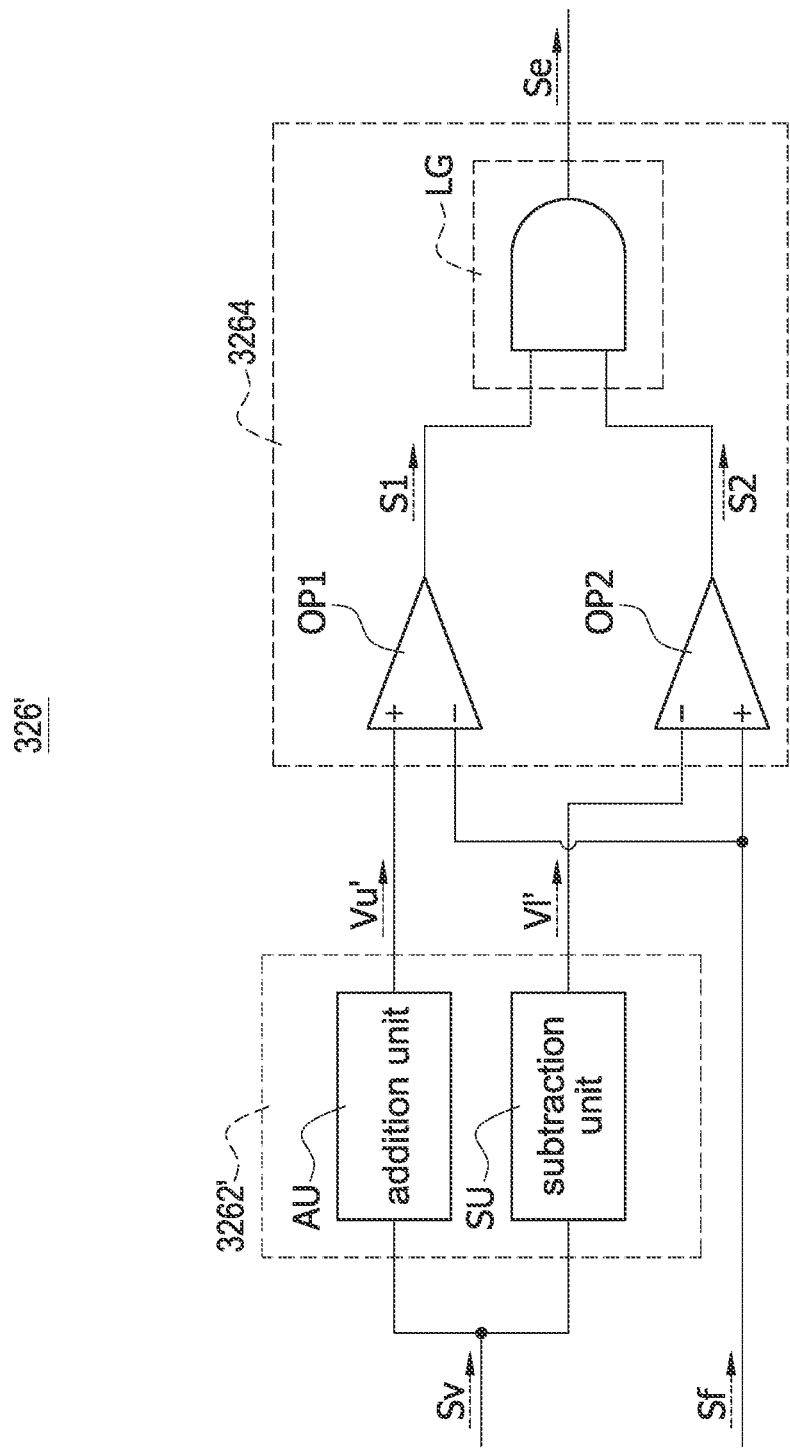
FIG. 4A is a block circuit diagram of the voltage level detector according to a second embodiment of the present disclosure.

Please refer to FIG. 4A, which shows a block circuit diagram of the voltage level detector according to a second embodiment of the present disclosure, and also refer to FIG. 1 to FIG. 2. The voltage level detector 326' shown in FIG. 4A is similar to the voltage level detector 326 shown in FIG. 3A, and the detail description is omitted here for conciseness. The difference between the FIG. 4A and the FIG. 3A is that the filtered signal Sf and the voltage signal Sv are just interchanged. In FIG. 3A, the voltage level detector 326 is based on the filtered signal Sf to generate the upper limit voltage Vu and the lower limit voltage Vl, and then the voltage signal Sv is checked whether between the upper limit voltage Vu and the lower limit voltage Vl. In FIG. 4A, the voltage level detector 326' is based on the voltage signal Sv to generate the upper limit voltage Vu' and the lower limit voltage Vl', and then the filtered signal Sf is checked whether between the upper limit voltage Vu' and the lower limit voltage Vl'.

The addition unit AU is used to add a first reference voltage V1 to the voltage signal Sv to generate the upper limit voltage Vu'; the subtraction unit SU is used to subtract a second reference voltage V2 from the voltage signal Sv to generate the lower limit voltage Vl'. The first comparison unit OP1 receives the upper limit voltage Vu' and the filtered signal Sf, and compares the upper limit voltage Vu' with the filtered signal Sf to provide a first comparison signal S1. The second comparison unit OP2 receives the lower limit voltage Vl' and the filtered signal Sf, and compares the lower limit voltage Vl' with the filtered signal Sf to provide a second comparison signal S2. In particular, the circuits and control manners not mentioned in FIG. 4A are the same as those in FIG. 3A, and the detail description is omitted here for conciseness.

Please refer to FIG. 4B, which shows a schematic waveform diagram of operating the voltage level detector with the AC voltage according to the second embodiment of the present disclosure, FIG. 4C, which shows a schematic waveform diagram of operating the voltage level detector without the AC voltage according to the second embodiment of the present disclosure, and also refer to FIG. 1 to FIG. 4A. The voltage level detector 3262' generates the upper limit voltage Vu' corresponding to the first reference voltage V1 according to the voltage signal Sv, and generates the lower limit voltage Vl' corresponding to the second reference voltage V2 according to the voltage signal Sv. In FIG. 4B, when the voltage value of the filtered signal Sf is rising (increased) or falling (decreased), the voltage difference X between the voltage signal Sv and the filtered signal Sf is less than the predetermined value since the filtered signal Sf falls between the upper limit voltage Vu' and the lower limit voltage Vl' for a short period of time. When the AC voltage Vac is present, since the voltage value of the filtered signal Sf is rising or falling, and a time period when the voltage value falls between the upper limit voltage Vu' and the lower limit voltage Vl' is shorter, the pulse number accumulated by the timer unit 328 is not greater than or equal to the predetermined number (or the time accumulated by the timer unit 328 is not greater than or equal to the predetermined time). At this condition, the control signal Sc provided by the timer unit 328 maintains the switch unit 330 to be turned off, and therefore the filter capacitor C is not released (discharged).

In FIG. 4C, at time t1, the plug is unplugged (removed). At this condition, the AC voltage Vac is disconnected so that the change of the voltage signal Sv with the continuous half-sine wave is interrupted so that the voltage signal Sv is slowly decreased by a roughly fixed value, and the fixed value is the remaining energy stored in the filter capacitor C. At this condition, since the change of the voltage signal Sv with the continuous half-sine wave is interrupted, the upper limit voltage Vu' and the lower limit voltage Vl' generated according to the voltage signal Sv are maintained at a fixed value. At this condition, the voltage value of the filtered voltage signal Sv (i.e., the filtered signal Sf) through the low-pass filter 324 is gradually close to the voltage signal Sv maintained at a fixed value. Therefore, the voltage value of the voltage signal Sv falls between the upper limit voltage Vu' and the lower limit voltage Vl', that is, the voltage value of the filtered signal Sf is close to the upper limit voltage Vu' and the lower limit voltage Vl' so that the voltage difference X is less than the predetermined value. For convenience of demonstration, when the plug is unplugged (removed) at time t1, the filtered signal Sf falls between the upper limit voltage Vu' and the lower limit voltage Vl'. In particular, the circuits and control manners not mentioned in FIG. 4B and FIG. 4C are the same as those in FIG. 3B and FIG. 3C, and the detail description is omitted here for conciseness.

Figure 5A:
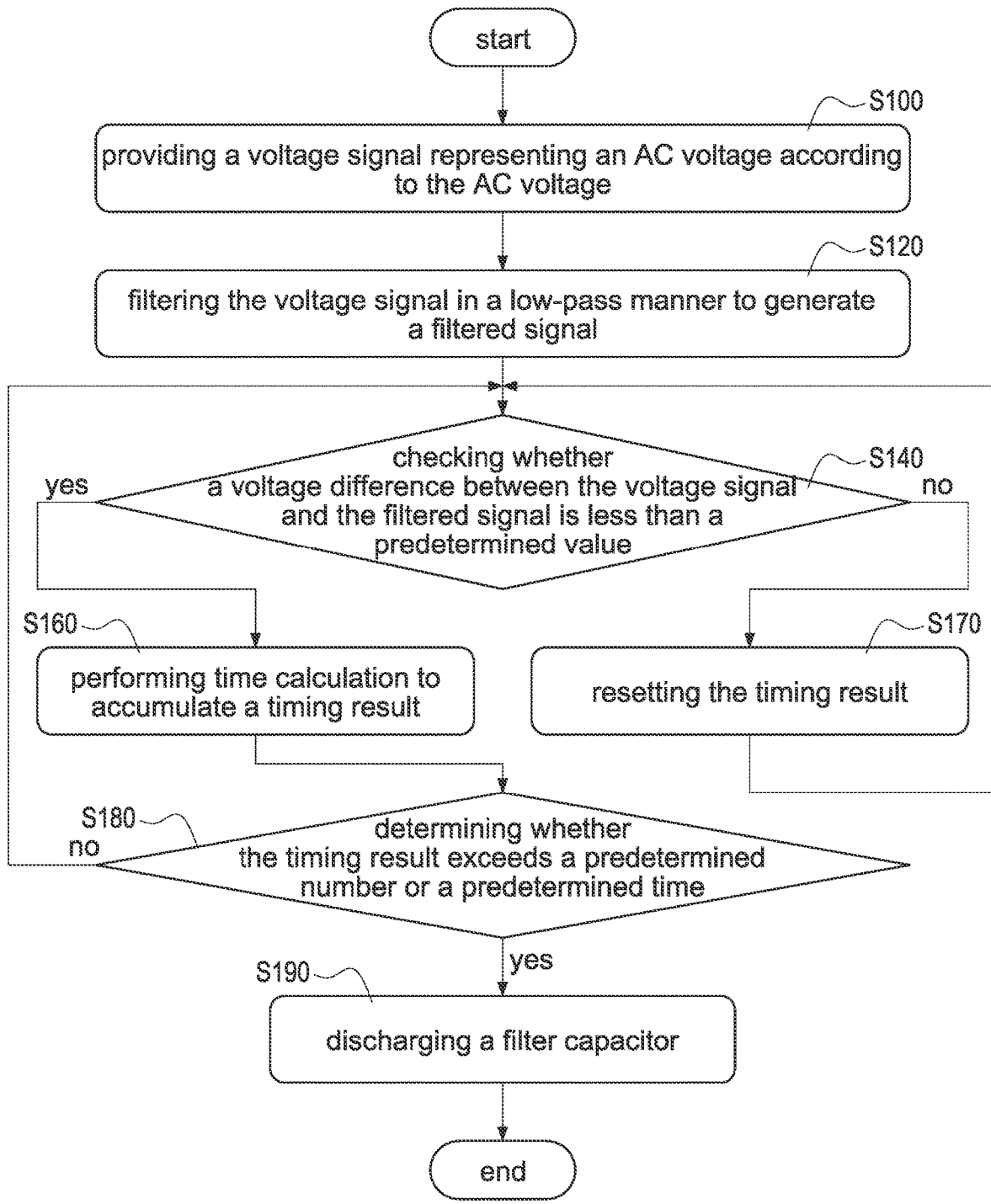
FIG. 5A is a flowchart of an operation method of discharging the filter capacitor according to the present disclosure.

Please refer to FIG. 5A, which shows a flowchart of an operation method of discharging the filter capacitor according to the present disclosure, and also refer to FIG. 1 to FIG. 4C. In FIG. 5A, it is mainly for the operation method of discharging the filter capacitor C at the input end 100-1 of the conversion circuit 100 when the AC voltage Vac is disconnected. The method includes steps of: providing a voltage signal Sv representing the AC voltage Vac according to the AC voltage Vac (S100). The detection circuit 10 detects the AC voltage Vac to acquire the detection signal Ss representing the AC voltage Vac, and the signal preparation circuit 322 processes (of stepping down) the detection signal Ss to acquire the voltage signal Sv. Afterward, filtering the voltage signal Sv in a low-pass manner to generate a filtered signal Sf (S120). The low-pass filter 324 receives the voltage signal Sv, and provides the filtered signal Sf according to the voltage signal Sv. Afterward, checking whether a voltage difference between the voltage signal and the filtered signal is less than a predetermined value (S140). The voltage level detector 326 checks whether the voltage difference X between the voltage signal Sv and the filtered signal Sf is less than the predetermined value, and provides the enabled signal Se to the timer unit 328 according to a check result. When the voltage difference X between the voltage signal Sv and the filtered signal Sf is greater than the predetermined value, the timer unit 328 is enabled by the enabled signal Se to reset the timing result (S170), and the step (S140) is executed again. In one embodiment, the timing result may be reset at any time point after the voltage difference X is greater than or equal to the predetermined value (as shown in FIG. 3C and FIG. 4C). For example, any time point in the following time intervals between tA-tB, tC-tD, t0-t1.

When the voltage difference X between the voltage signal Sv and the filtered signal Sf is less than the predetermined value, it means that the voltage value of the voltage signal Sv is close to the voltage value of the filtered signal Sf. The reason may be that the voltage value of the AC voltage Vac is rising (increased) or falling (decreased), or the plug is unplugged (removed). At this condition, the timer unit 328 is enabled by the enabled signal Se to perform time calculation (counting) to generate pulse number according to the clock signal CLK, and therefore the timing result of the previous loop is accumulated (S160). Afterward, determining whether the timing result exceeds a predetermined number or a predetermined time (S180). When the timing result does not exceed the predetermined number or the predetermined time, is means that the voltage value of the AC voltage Vac may be rising (increased) or falling (decreased), and therefore the step (S140) is executed again to check whether the voltage difference X is less than the predetermined value. Finally, discharging the filter capacitor C when the timing result exceeds a predetermined time (S190). When the pulse number is greater than or equal to a predetermined number or the time counted is greater than or equal to the predetermined time, it means that the plug is unplugged (removed). At this condition, the timer unit 328 controls the switch unit 330 to turn on through the control signal Sc so that the energy stored in the filter capacitor C is released (discharged) through the turned-on switch unit 330.

Figure 5B:
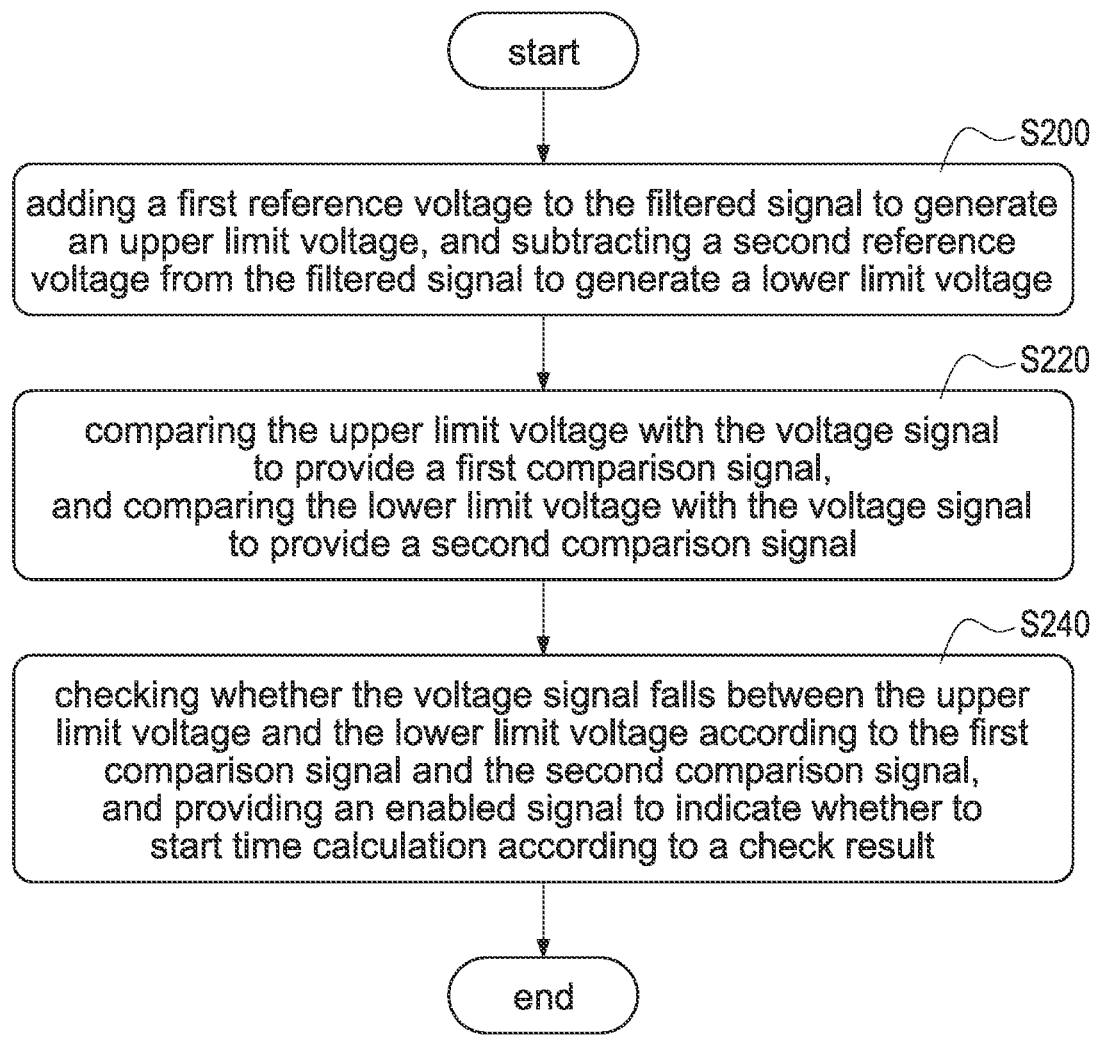
FIG. 5B is a flowchart of an operation method of detecting range according to a first embodiment of the present disclosure.
Figure 5C:
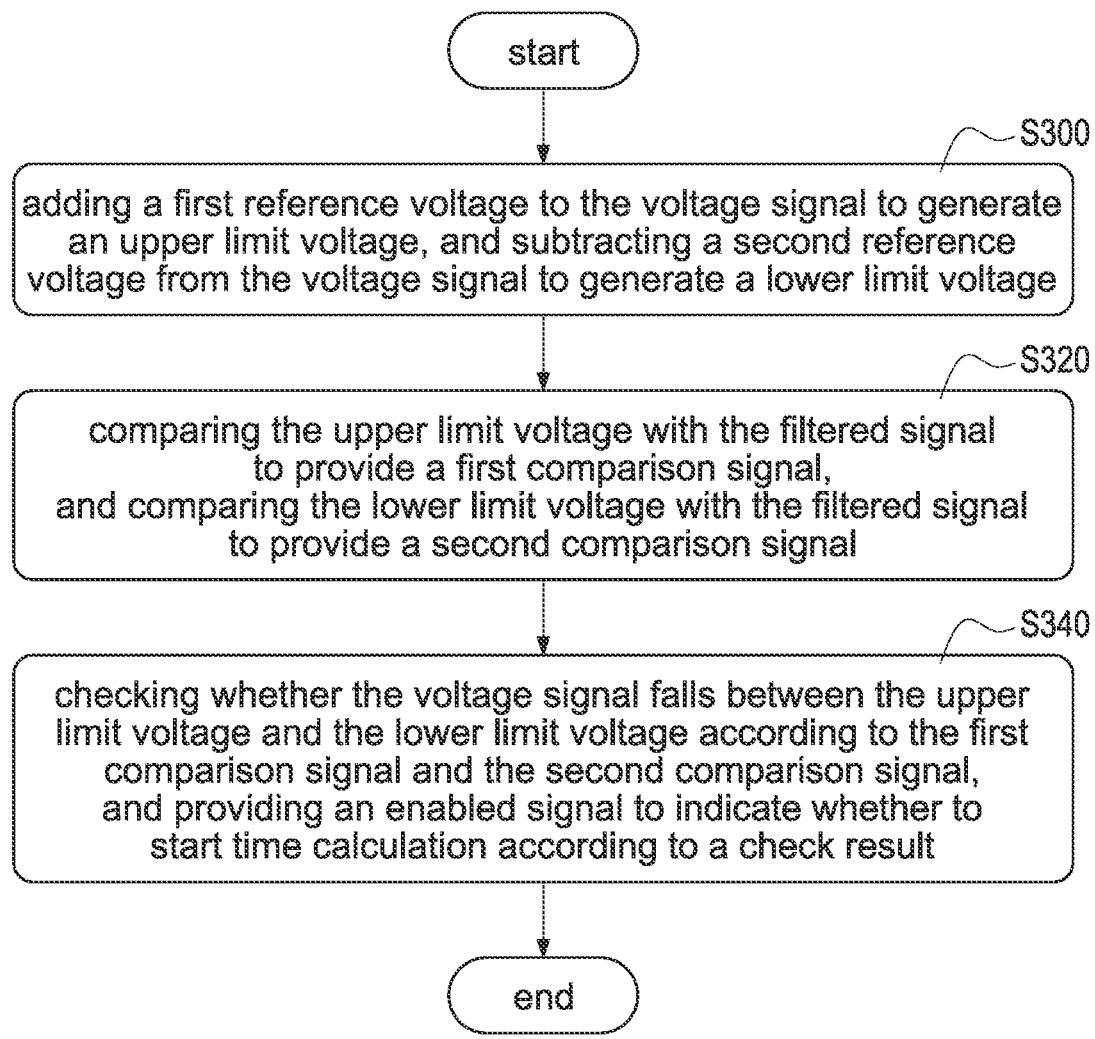
FIG. 5C is a flowchart of the operation method of detecting range according to a second embodiment of the present disclosure.

Please refer to FIG. 5B, which shows a flowchart of an operation method of detecting range according to a first embodiment of the present disclosure, FIG. 5C, which shows a flowchart of the operation method of detecting range according to a second embodiment of the present disclosure, and also refer to FIG. 1 to FIG. 5A. In FIG. 5B, the step (S140) includes steps (S200), (S220), and (S240). The method includes steps of: adding a first reference voltage V1 to the filtered signal Sf to generate the upper limit voltage Vu by an addition unit AU, and subtracting a second reference voltage V2 from the filtered signal Sf to generate the lower limit voltage V1 (S200). Afterward, comparing the upper limit voltage Vu with the voltage signal Sv to provide a first comparison signal S1 by a first comparison unit OP1, and comparing the lower limit voltage V1 with the voltage signal Sv to provide a second comparison signal S2 by a second comparison unit OP2 (S220). The logic unit LG receives the first comparison signal S1 and the second comparison signal S2 to check whether the voltage signal Sv falls between the upper limit voltage Vu and the lower limit voltage V1. Afterward, providing an enabled signal Se to indicate whether to perform time calculation according to a check result (S240). When the first comparison signal S1 and the second comparison signal S2 are both a first level, it means that the voltage difference between the voltage signal Sv and the filtered signal Sf is less than the predetermined value. At this condition, the comparison circuit 3264 uses the enabled signal Se to notify the timer unit 328 to perform time calculation (counting), that is, the timer unit 328 performs counting the clock signal CLK.

In FIG. 5C, the step (S140) includes steps (S300), (S320), and (S340). The method includes steps of: adding a first reference voltage V1 to the voltage signal Sv to generate the upper limit voltage Vu' by an addition unit AU, and subtracting a second reference voltage V2 from the voltage signal Sv to generate the lower limit voltage V1' (S300). Afterward, comparing the upper limit voltage Vu' with the filtered signal Sf to provide a first comparison signal S1 by a first comparison unit OP1, and comparing the lower limit voltage V1' with the filtered signal Sf to provide a second comparison signal S2 by a second comparison unit OP2 (S320). The next step (S340) is similar to the step (S240) in FIG. 5B, and the detail description is omitted here for conciseness.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A filter capacitor discharge circuit, comprising:
    a high-voltage terminal coupled to a filter capacitor at an input end, and the input end receiving an AC voltage,
    a signal preparation circuit coupled to the high-voltage terminal, and configured to generate a voltage signal representing the AC voltage,
    a low-pass filter configured to provide a filtered signal corresponding to the AC voltage according to the voltage signal,
    a voltage level detector configured to compare the voltage signal and the filtered signal, and check whether a voltage difference between the voltage signal and the filtered signal is less than a predetermined value,
    a timer unit configured to perform time calculation to accumulate a timing result when the voltage difference is less than the predetermined value, and
    a switch unit being turned on by the timer unit when the timing result exceeds a predetermined time so that the filter capacitor is discharged through the switch unit.

2. The filter capacitor discharge circuit as claimed in claim 1, wherein the voltage level detector comprises:
    a limit generation circuit configured to generate an upper limit voltage and a lower limit voltage according to the filtered signal, and
    a comparison circuit configured to check whether the voltage signal falls between the upper limit voltage and the lower limit voltage, and provide an enabled signal to the timer unit according to a check result.

3. The filter capacitor discharge circuit as claimed in claim 2, wherein the limit generation circuit comprises:
    an addition unit configured to add a first reference voltage to the filtered signal to generate the upper limit voltage, and
    a subtraction unit configured to subtract a second reference voltage from the filtered signal to generate the lower limit voltage.

4. The filter capacitor discharge circuit as claimed in claim 2, wherein the comparison circuit comprises:

a first comparison unit configured to compare the upper limit voltage with the voltage signal to provide a first comparison signal, a second comparison unit configured to compare the lower limit voltage with the voltage signal to provide a second comparison signal, and a logic unit configured to provide the enabled signal according to the first comparison signal and the second comparison signal.

5. The filter capacitor discharge circuit as claimed in claim 1, wherein the voltage level detector comprises:

a limit generation circuit configured to generate an upper limit voltage and a lower limit voltage according to the voltage signal, and a comparison circuit configured to check whether the filtered signal falls between the upper limit voltage and the lower limit voltage, and provide an enabled signal to the timer unit according to a check result.

6. The filter capacitor discharge circuit as claimed in claim 5, wherein the limit generation circuit comprises:

an addition unit configured to add a first reference voltage to the voltage signal to generate the upper limit voltage, and a subtraction unit configured to subtract a second reference voltage from the voltage signal to generate the lower limit voltage.

7. The filter capacitor discharge circuit as claimed in claim 5, wherein the comparison circuit comprises:

a first comparison unit configured to compare the upper limit voltage with the filtered signal to provide the first comparison signal, a second comparison unit configured to compare the lower limit voltage with the filtered signal to provide the second comparison signal, and a logic unit configured to provide the enabled signal according to the first comparison signal and the second comparison signal.

8. The filter capacitor discharge circuit as claimed in claim 1, wherein the timer unit is configured to generate a pulse number by counting a clock signal; when the pulse number is greater than or equal to a predetermined number, the timer unit determines that the timing result exceeds the predetermined time so that the switch unit is turned on.

9. The filter capacitor discharge circuit as claimed in claim 1, wherein when the timing result does not exceed the predetermined time and the voltage difference becomes greater than or equal to the predetermined value, the timing result is reset.

10. A conversion circuit, comprising:

a filter capacitor receiving an AC voltage at an input end, a detection circuit configured to detect the AC voltage to provide a detection signal, and a filter capacitor discharge circuit claimed in claim 1 configured to receive the detection signal through the high-voltage terminal.

11. An operation method of discharging a filter capacitor, the filter capacitor coupled to an input end to receive an AC voltage, the operation method comprising steps of:

providing a voltage signal representing the AC voltage according to the AC voltage, filtering the voltage signal in a low-pass manner to generate a filtered signal corresponding to the AC voltage, checking whether a voltage difference between the voltage signal and the filtered signal is less than a predetermined value, performing time calculation to accumulate a timing result when the voltage difference is less than the predetermined value, and discharging the filter capacitor when the timing result exceeds a predetermined time.

12. The operation method as claimed in claim 11, further comprising steps of:

generating an upper limit voltage and a lower limit voltage according to the filtered signal, and checking whether the voltage signal falls between the upper limit voltage and the lower limit voltage, and providing an enabled signal of whether to perform time calculation according to a check result.

13. The operation method as claimed in claim 12, further comprising steps of:

adding a first reference voltage to the filtered signal to generate the upper limit voltage and subtracting a second reference voltage from the filtered signal to generate the lower limit voltage, comparing the upper limit voltage with the voltage signal to provide a first comparison signal and comparing the lower limit voltage with the voltage signal to provide a second comparison signal, and providing the enabled signal according to the first comparison signal and the second comparison signal.

14. The operation method as claimed in claim 11, further comprising steps of:

generating an upper limit voltage and a lower limit voltage according to the voltage signal, and checking whether the filtered signal falls between the upper limit voltage and the lower limit voltage, and providing an enabled signal of whether to perform time calculation according to a check result.

15. The operation method as claimed in claim 14, further comprising steps of:

adding a first reference voltage to the voltage signal to generate the upper limit voltage and subtracting a second reference voltage from the voltage signal to generate the lower limit voltage, comparing the upper limit voltage with the filtered signal to provide a first comparison signal and comparing the lower limit voltage with the filtered signal to provide a second comparison signal, and providing the enabled signal according to the first comparison signal and the second comparison signal.

16. The operation method as claimed in claim 11, wherein the step of "discharging the filter capacitor when the timing result exceeds a predetermined time" comprises a step of:

discharging the filter capacitor when a pulse number, which is generated by counting a clock signal, is greater than or equal to a predetermined number.

17. The operation method as claimed in claim 11, further comprising a step of:

resetting the timing result when the timing result does not exceed the predetermined time and the voltage difference becomes greater than or equal to the predetermined value.

* * * * *